United States Patent
Morrow et al.

(10) Patent No.: US 6,597,275 B2
(45) Date of Patent: Jul. 22, 2003

(54) INTRUSION BARRIER FOR THERMOSTAT

(75) Inventors: Benjamin V. Morrow, Pennellville, NY (US); Ronald B. Kadah, Fayetteville, NY (US)

(73) Assignee: International Controls and Measurement Corp., Cicero, NY (US)

( * ) Notice: Subject to any disclaimer, the term of this patent is extended or adjusted under 35 U.S.C. 154(b) by 0 days.

(21) Appl. No.: 10/008,273

(22) Filed: Nov. 5, 2001

(65) Prior Publication Data

US 2003/0085291 A1 May 8, 2003

(51) Int. Cl.$^7$ ............................. F23N 5/20; G05D 15/00
(52) U.S. Cl. ...................... 337/381; 236/78 R; 337/398
(58) Field of Search ..................... 236/DIG. 19, 78 R; 337/381, 327, 398

(56) References Cited

U.S. PATENT DOCUMENTS 2,558,610 A * 6/1951 Diekhoff ................... 236/68 B
2,599,569 A * 6/1952 McLarty ............... 236/DIG. 19

FOREIGN PATENT DOCUMENTS

JP          0134315      * 8/1982     ......... 236/DIG. 19

* cited by examiner

Primary Examiner—William Wayner
(74) Attorney, Agent, or Firm—Bernhard P. Molldrem, Jr.

(57) ABSTRACT

A plug or grommet fits into the opening in the back plate of a thermostat and blocks or diverts intrusion air from entering the interior of the thermostat housing from the wall penetration for the thermostat wires. The thermostat wires are fed through the grommet, which is a soft rubbery material that closes over the wires and blocks the intrusion air. Alternatively, a wall plate can be used between the back plate of the thermostat and the wall where the thermostat is mounted.

7 Claims, 1 Drawing Sheet

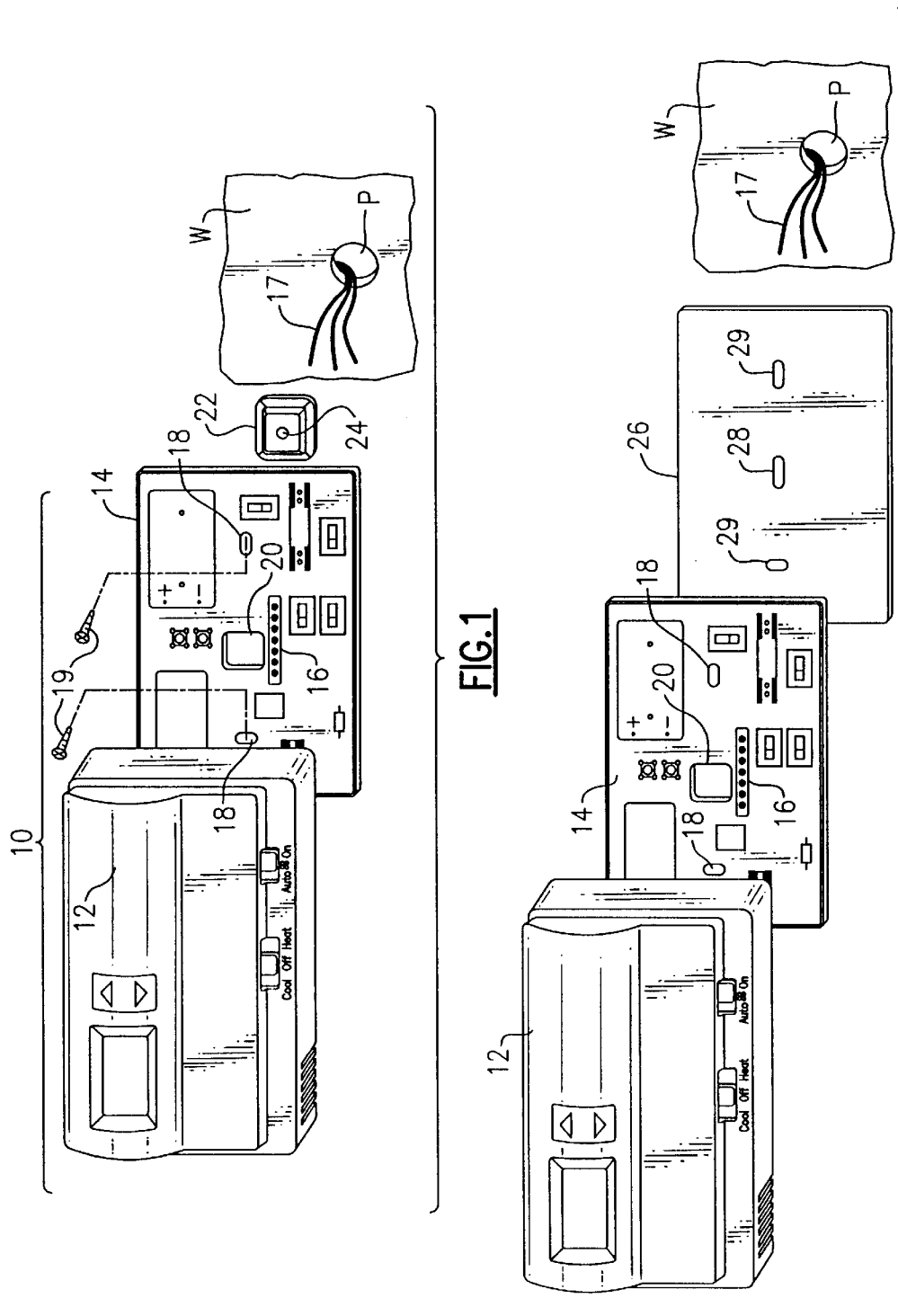

INTRUSION BARRIER FOR THERMOSTAT

BACKGROUND OF THE INVENTION

This invention relates to control devices for controlling the temperature, humidity, and/or other environmental conditions in an interior comfort space, and is more particularly concerned with an improvement to a wall thermostat to prevent inaccuracies and misoperation that may result from intrusion air which may enter the thermostat from a hollow wall on which the thermostat is mounted.

Wall thermostats are typically installed on an interior wall of a house or other building to control the operation of a furnace, air conditioner, heat pump, or other environmental control equipment. The thermostat is intended to monitor the temperature of the room or other interior comfort space continuously, and to adjust the operation of the associated environmental control equipment to keep the interior comfort space parameter (e.g., temperature) within some range (e.g., 68° F., ±1.0° F.). Other controls may be sensitive to other parameters, such as humidity or particulate level. The thermostat is connected to the furnace, air conditioner, heat pump or the like by means of a run of thermostat wires, which pass from the furnace control board up through spaces in the interior walls, and emerge at an opening in one of the walls, and this is the place the thermostat is to be mounted. An opening is provided in the back of the thermostat for the wires to pass through, so that the wires can be connected to appropriate contacts inside the thermostat housing.

In practice, the opening or penetration in the wall for the thermostat wires allows some intrusion air to enter the room, and this air passes through the thermostat opening, into the interior of the thermostat housing. As a result, the sensors inside the housing are influenced to a significant degree by intrusion air that comes through the hollow wall, and this air can be warmer or cooler than the rest of the air in the room. Even if a contractor plasters or caulks the wire opening during construction of the house, the plaster or caulk can eventually dry and crack, and permit intrusion air to enter the thermostat. As a result, the actual room air temperature (or humidity) can be outside the range set on the thermostat (or humidistat), and this can occur without any malfunction of either the thermostat or the environmental control equipment.

OBJECT AND SUMMARY OF THE INVENTION

Accordingly, it is an object of the present invention to provide an improvement to a wall thermostat that overcomes the above-mentioned drawback(s) of the prior art.

It is another object to provide an effective solution to the above-mentioned problem, which solution is of a straightforward, one-piece design, and which is simple to install.

It is a more specific object to provide a barrier that diverts or blocks intrusion air from entering the thermostat or other similar control device.

In accordance with one aspect of the present invention, a thermostat arrangement that is adapted for mounting on a wall of a controlled space includes a thermostat having a front cover and a back plate adapted to be mounted on the interior wall. The back plate and the cover defining a cavity, and the temperature sensor and other control circuitry are contained within this cavity. The circuitry includes contacts which are adapted to receive two or more thermostat wires that protrude through a penetration in the wall. The back plate has mounting screw openings for mount the thermostat on said wall over said penetration, and also has a thermostat wire opening adapted to receive the two or more thermostat wires. As a means for blocking or redirecting intrusion air flow that may come out of the wall penetration and to avoid having the intrusion air enter the interior cavity of the thermostat, a resilient plug is fitted into said thermostat wire opening in the back plate. This plug may be a grommet of cross section to match that opening, and may be formed of a soft, resilient material, i.e., a rubbery material. The plug has a passage through which the thermostat wires are passed, with this passage closing over the thermostat wires.

Alternatively, a wall plate member may serve as a barrier to block intrusion air from the thermostat. In this case, the wall plate member is adapted to be installed between the wall and the back plate of the thermostat. The wall plate has a wire passage that is to be aligned with the wall penetration and through which said thermostat wires are passed. The passage closes over the thermostat wires. The wall plate member serves as a barrier to direct intrusion air that flows out the penetration away from the cavity of said thermostat.

In either case, any intrusion air ends up being mixed in with the room air, and does not pass directly into the thermostat. The thermostat then senses the room air parameters, e.g., temperature or humidity, much more accurately, and permits the furnace, air conditioner, heat pump, or other environmental control equipment to keep the interior room air within the comfort range that is set on the device.

The above and many other objects, features, and advantages of this invention will be more fully appreciated from the ensuing description of certain preferred embodiments, which are to be read in conjunction with the accompanying Drawing.

BRIEF DESCRIPTION OF THE DRAWING

FIG. 1 is an exploded assembly view of a thermostat with a thermostat wire grommet, according to an embodiment of the present invention.

FIG. 2 is an exploded assembly view of a thermostat with a wall plate, according to another embodiment of this invention.

DETAILED DESCRIPTION OF THE PREFERRED EMBODIMENT

With reference now to the Drawing, FIG. 1 shows a wall thermostat assembly 10 that is to be mounted onto a wall W of a room of a dwelling, commercial building, or other structure where a human comfort space is to be maintained within some desired range of temperature. Here the thermostat 10 comprises a front cover 12 which is fits onto a back plate 14. There are sensors, switches, and electrical and electronic components mounted on the back plate 14, which elements are of any well known configuration, and are not shown in detail and not discussed here, except that a contact strip 16 is present for connecting some number of thermostat wires 17, here shown protruding out a hole or penetration P in the wall W. In this thermostat 10, there are screw holes 18 provided at the left and right sides of the back plate 14, and a pair of threaded fasteners 19 that mount the back plate 14 onto the wall W. The back plate is positioned on the wall so that a thermostat wire opening 20, which is at or near the center of the back plate 14, is aligned over the wall penetration P.

A grommet or plug 22 is formed of rubber, or of another generally soft, resilient material, and is dimensioned to fit snugly into the wire opening 20 in the back plate 14. There is an opening 24 in the center part of the grommet 22, and the thermostat wires are passed through this opening 24. When the grommet 22 is then pushed into the opening 20, the rubbery material is squeezed against the thermostat wires, closing off the opening. Then, the back plate is installed onto the wall W, using the screws or other fasteners 19. The grommet 22 blocks the opening 20, so that the path of least resistance for any intrusion air from the penetration P is around the grommet, and into the room space, where the intrusion air mixes with the rest of the room air and does not directly affect the action of the thermostat.

As shown in FIG. 2, the thermostat 10 is again shown in an alternative embodiment, in which a wall plate 26 is disposed between the wall W and the back plate 14 of the thermostat. Here, the elements of the thermostat 10, wires 17, and wall W are identified with the same reference numbers as in FIG. 1, and do not need to be discussed in great detail.

In FIG. 2, prior to installation of the back plate 14 onto the wall W, the thermostat wires 17 are threaded through a small central wire opening 28 in the wall plate. Then the wires are passed through the opening 20 of the back plate, and the latter is installed onto the wall W using the threaded fasteners 19. Slots 29 or similar passages for the fasteners 19 are provided on the left and right sides of the wall plate 26. Then, the wires 17 are attached to the appropriate contacts in the strip 16, and the cover 12 is snapped in place on the back plate 14.

In the FIG. 2 embodiment, the wall plate can be made of a resilient material, so that the opening 28 closes snugly over the wires 17, and blocks any flow of intrusion air from entering the interior space of the thermostat 10. Alternatively, the wall plate 26 can be made of a more rigid material, with a central insert of a resilient material, and with the opening 28 being in this insert.

It is entirely possible to employ both the wall plate 26 of FIG. 2 and the plug or grommet 22 of FIG. 1 in the same thermostat, although each alternative can function well independently. While not specifically shown here, there may be slots or channels provided in the wall-facing side of the wall plate 26, so that intrusion air has a pathway into the general room air space. However, the small irregularities and texture of the wall W will generally provide sufficient clearance for this diversion air flow.

Here, the thermostat 10 is of generally rectangular shape, but the concepts of this invention will perform equally well with thermostats of other shapes and designs. The same is true for the shape of the opening 20, and grommets 22 can be made to suit thermostat wire openings of other shapes and dimensions. A slot may be provided in some embodiments in place of the wire opening 24 shown for this embodiment. While the above design is preferred, an alternative design for either a grommet or a wall plate could comprise two or more sections.

While the invention has been described with reference to specific preferred embodiments, the invention is certainly not limited to those precise embodiments. Rather, many modifications and variations will become apparent to persons of skill in the art without departure from the scope and spirit of this invention, as defined in the appended claims.

We claim:

1. A thermostat arrangement adapted for mounting on a wall of a controlled space, comprising:

a thermostat having a front cover and a back plate adapted to be mounted on said wall, with the back plate and the cover defining a cavity within which are contained control circuitry, and contacts which are adapted to receive two or more thermostat wires that protrude through a penetration of said wall; the back plate including fastener holes adapted for receiving attaching means to mount the thermostat on said wall over said penetration, and a thermostat wire opening adapted to receive said two or more thermostat wires that protrude from said penetration in said wall; and a wall plate member adapted to be installed between said wall and the back plate of said thermostat, the wall plate member having a small wire passage aligned with said penetration and through which said thermostat wires are passed, the wall plate member, at the location of said passage, being formed of a material capable of closing over said wires and said wall plate member serving as a barrier to direct air flowing out the penetration in said wall away from the cavity of said thermostat.

2. The thermostat arrangement according to claim 1, wherein said wall plate member includes slots that are adapted to align with the positions of said fastener holes.

3. A thermostat arrangement, adapted for mounting on a wall of a controlled space, comprising:

a thermostat having a front cover and a back plate adapted to be mounted on said wall, with the back plate and the cover defining a cavity within which are contained control circuitry, and contacts which are adapted to receive two or more thermostat wires that protrude through a penetration of said wall; the back plate including fastener holes adapted for receiving attaching means to mount the thermostat on said wall over said penetration, and a thermostat wire opening adapted to receive said two or more thermostat wires that protrude from said penetration in said wall; and a wall plate member adapted to be installed between said wall and the back plate of said thermostat, the wall plate member having a small wire passage aligned with said penetration and through which said thermostat wires are passed, said passage closing over said wires and said wall plate member serving as a barrier to direct air flowing out the penetration in said wall away from the cavity of said thermostat; wherein said wall plate member is formed of a flexible resilient material at least at the location of said wire passage.

4. A thermostat arrangement adapted for mounting on a wall of a controlled space, comprising:

a thermostat having a front cover and a back plate adapted to be mounted on said wall, with the back plate and the cover defining a cavity within which are contained control circuitry, and contacts which are adapted to receive two or more thermostat wires that protrude through a penetration of said wall; the back plate including openings adapted for receiving attaching means to mount the thermostat on said wall over said penetration, and a thermostat wire opening adapted to receive said two or more thermostat wires that protrude from said penetration in said wall; and an intrusion air barrier positioned at the thermostat wire opening of said back plate but not blocking the penetration through said wall, and comprised at least partly of a flexible resilient material having a passage through which said thermostat wires are passed, said passage closing over said wires, and said barrier serving to direct air flowing out the penetration in said wall away from the cavity of said thermostat.

5. The thermostat arrangement according to claim 4, wherein said intrusion air barrier includes a resilient plug fitting into the thermostat wire opening of the back plate.

6. The thermostat arrangement according to claim 5, wherein said plug includes a soft rubbery grommet.

7. The thermostat arrangement according to claim 6, wherein said grommet is generally rectangular.

* * * * *